(12) United States Patent
Niki

(10) Patent No.: US 11,469,270 B2
(45) Date of Patent: Oct. 11, 2022

(54) SEMICONDUCTOR STORAGE DEVICE

(71) Applicant: Kioxia Corporation, Tokyo (JP)

(72) Inventor: Yusuke Niki, Yokohama (JP)

(73) Assignee: Kioxia Corporation, Tokyo (JP)

(*) Notice: Subject to any disclaimer, the term of this patent is extended or adjusted under 35 U.S.C. 154(b) by 67 days.

(21) Appl. No.: 17/167,223

(22) Filed: Feb. 4, 2021

(65) Prior Publication Data

US 2022/0059617 A1     Feb. 24, 2022

(30) Foreign Application Priority Data

Aug. 19, 2020   (JP) .............................. JP2020-138892

(51) Int. Cl.
*H01L 27/24*     (2006.01)

(52) U.S. Cl.
CPC ...... *H01L 27/2436* (2013.01); *H01L 27/2463* (2013.01)

(58) Field of Classification Search
CPC ... H01L 27/2436; H01L 27/2463; G11C 8/12; G11C 8/14; G11C 2213/72; G11C 11/1657; G11C 13/0028
See application file for complete search history.

(56) References Cited

U.S. PATENT DOCUMENTS

| 2016/0141039 A1 | 5/2016 | Arakawa |
| 2021/0082507 A1 | 3/2021 | Niki |
| 2021/0265259 A1 | 8/2021 | Niki |

FOREIGN PATENT DOCUMENTS

| JP | 2021-44041 A | 3/2021 |
| JP | 2021-136042 A | 9/2021 |

OTHER PUBLICATIONS

U.S. Appl. No. 16/782,114, filed Feb. 5, 2020, Niki.
U.S. Appl. No. 17/016,795, filed Sep. 10, 2020, Niki.

*Primary Examiner* — Marvin Payen
(74) *Attorney, Agent, or Firm* — Oblon, McClelland, Maier & Neustadt, L.L.P.

(57) ABSTRACT

A memory includes first signal-lines divided into groups. Global signal lines correspond to the first signal-lines. The global signal-lines include a selected global signal-line and a non-selected global signal-line. First transistors correspond to the first signal-lines. The first transistors are connected between a corresponding first signal-line and any of the global signal-lines. Selection signal-lines correspond to the groups. The selection signal-lines are connected to gate electrodes of the first transistors included in a corresponding group. Second transistors are connected between the first signal-lines that belong to adjacent two of the groups. When one of the first signal-lines which is electrically connected to the selected global signal-line is a selected first signal-line, the first transistors corresponding to one of the groups which includes the selected first signal-line is in a conducting state. One of the second transistors which is connected to the selected first signal-line is in a non-conducting state.

13 Claims, 12 Drawing Sheets

SEMICONDUCTOR STORAGE DEVICE

CROSS REFERENCE TO RELATED APPLICATIONS

This application is based upon and claims the benefit of priority from the prior Japanese Patent Application No. 2020-138892, filed on Aug. 19, 2020, the entire contents of which are incorporated herein by reference.

FIELD

The embodiments of the present invention relate to a semiconductor device and manufacturing method thereof.

BACKGROUND

In recent years, the number of bit lines and word lines is increasing along with increase of the capacity of a semiconductor storage device. The increase of the number of bit lines and word lines causes increase of the arrangement area of a decoder for selecting the bit lines or the word lines. Therefore, it is desired to reduce the arrangement area of a multiplexer for selecting the bit lines or the word lines in the decoder.

In order to reduce the arrangement area of the multiplexer, it is considered to decrease a portion of transistors included in the multiplexer, for example. However, when a transistor is simply omitted from the multiplexer, controllability and flexibility of application of a voltage to a bit line or a word line are reduced. As a result, it can become difficult to appropriately control the voltage of a non-selected bit line or a non-selected word line other than a selected bit line or a selected word line.

DETAILED DESCRIPTION

Figure 1:
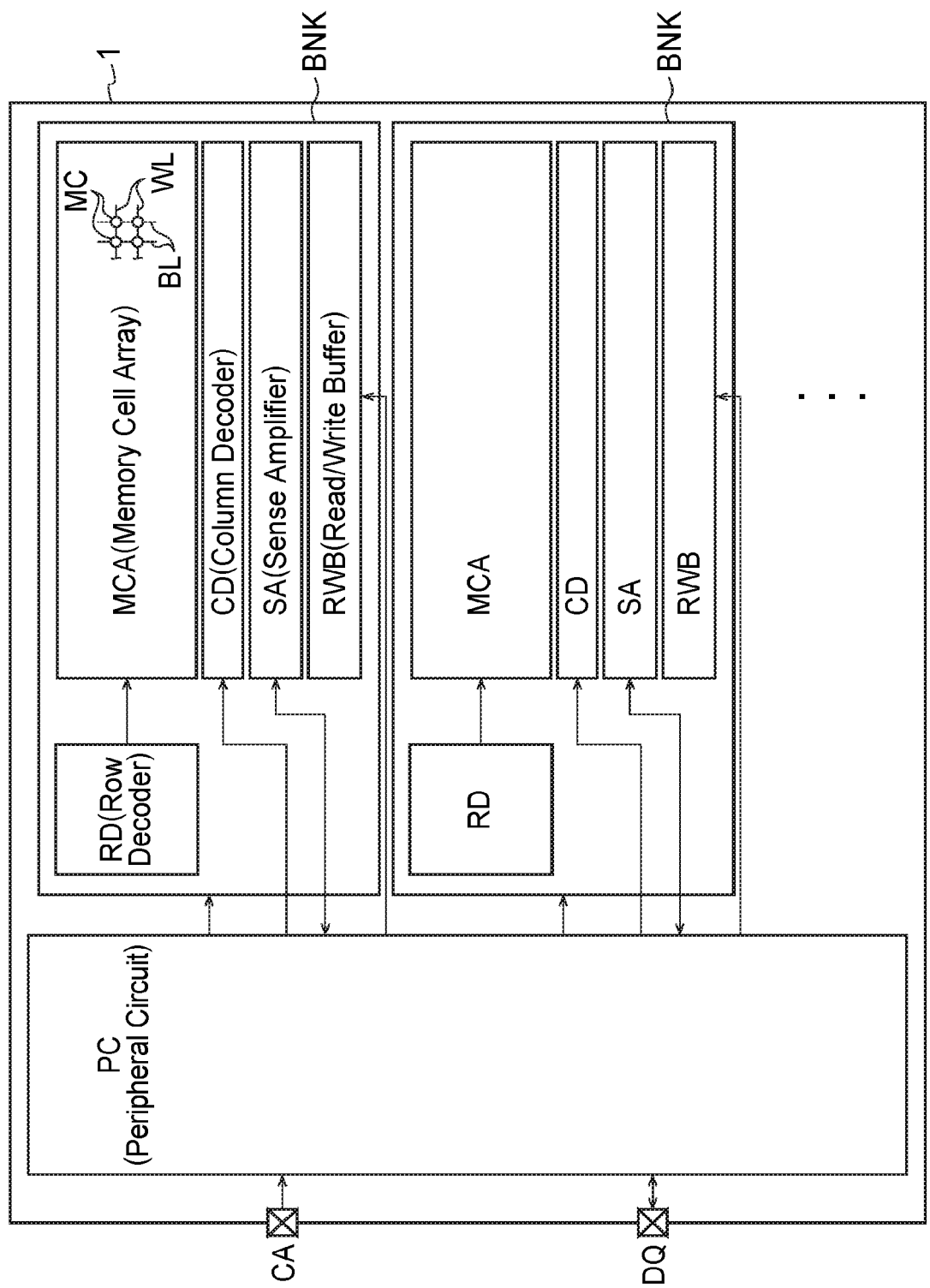
FIG. 1 is a block diagram illustrating a configuration example of a semiconductor storage device according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A semiconductor storage device according to the present invention comprises: a plurality of first signal lines divided into a plurality of groups each including m (m is an integer equal to or larger than 2) first signal lines; and a plurality of second signal lines. A memory cell array includes a plurality of memory cells provided to correspond to respective intersections of the first signal lines and the second signal lines. A plurality of global signal lines are provided to respectively correspond to the first signal lines included in one or a plurality of the groups. The global signal lines include a selected global signal line configured to transmit a selection voltage and a non-selected global signal line configured to transmit a non-selection voltage. A plurality of first transistors are provided to respectively correspond to the first signal lines. One of the first transistors is connected between a corresponding one of the first signal lines and any of the global signal lines. A plurality of selection signal lines are provided to respectively correspond to the groups. One of the selection signal lines is connected to gate electrodes of the first transistors included in a corresponding one of the groups in common. A plurality of second transistors are connected between the first signal lines that respectively belong to adjacent two of the groups. When the first signal lines is electrically connected to the selected global signal line as a selected first signal line, the first transistors corresponding to one of the groups which includes the selected first signal line are in a conducting state. One of the second transistors which is connected to the selected first signal line is in a non-conducting state.

First Embodiment

FIG. 1 is a block diagram illustrating a configuration example of a semiconductor storage device according to a first embodiment. A semiconductor storage device 1 can be, for example, a volatile memory such as a DRAM or a non-volatile memory such as a NAND EEPROM (Electrically Erasable and Programmable Read-Only-Memory), a ReRAM, an MRAM, and a PCM. Furthermore, the semiconductor storage device 1 can be, for example, a single memory chip or a module including a plurality of memory chips, such as a DIMM (Dual Inline Memory Module).

The semiconductor storage device 1 illustrated in FIG. 1 is configured as a single memory chip, for example. Hereinafter, the semiconductor storage device 1 is referred to as "memory chip 1". The memory chip 1 includes a memory cell array MCA, a column decoder CD, a row decoder RD, a sense amplifier SA, a read/write buffer RWB, and a peripheral circuit PC.

The memory cell array MCA includes a plurality of memory cells MC that are, for example, two-dimensionally arranged in a matrix. The memory cells MC are, for example, PCMs. The memory cells MC are arranged to correspond to respective intersections of bit lines BL and word lines WL, for example. The memory cells MC are each sandwiched between a corresponding word line WL and a corresponding bit line BL in a direction intersecting with extending directions of the word line WL and the bit line BL (for example, a direction perpendicular to those extending directions). That is, the memory cell array MCA is a so-called cross-point memory cell array. The bit lines BL intersect with the word lines WL substantially at a right angle, when viewed from above a semiconductor substrate. The bit lines BL are each connected to one ends of the memory cells MC of the memory cell array MCA. The word lines WL are each connected to other ends of the memory cells MC of the memory cell array MCA or can function as gate electrodes. The memory cell array MCA is divided into a plurality of banks BNK in one chip. The sense amplifier SA, a data latch DL, an address latch AL, and the like are provided for each bank BNK, for example.

The sense amplifier SA is connected to the memory cells MC via the column decoder CD and the bit lines BL, for example, and applies a write voltage (for example, VDD or VSS) or a read voltage to the memory cells MC via the bit lines BL. The sense amplifier SA applies the write voltage to a memory cell MC to write data into that memory cell MC, or applies the read voltage to a memory cell MC to read data from that memory cell MC.

The read/write buffer RWB temporarily retains data detected by the sense amplifier SA and an address for each page or temporarily retains data to be written into the memory cell array MCA and an address for each page.

The row decoder RD and the column decoder CD access the memory cell array MCA based on a bank address and a page address and apply the write voltage or the read voltage to a selected word line WL and a selected bit line BL. The row decoder RD applies the write voltage or the read voltage to a selected word line selected from the word lines WL. The column decoder CD connects a selected bit line selected from the bit lines BL to the sense amplifier SA. The sense amplifier SA applies the write voltage or the read voltage to the selected bit line. Accordingly, the memory chip 1 can write data into a desired memory cell MC in the memory cell MC or read data from the desired memory cell MC.

Although not illustrated, the peripheral circuit PC includes a voltage generator, a read/write engine, an address controller, a command controller, and an input/output circuit, for example.

The voltage generator generates a voltage for the word lines WL and a voltage for the bit lines BL required for a data read operation and a data write operation.

The read/write engine controls the column decoder CD and the row decoder RD to write data into a desired memory cell MC in the bank BNK or read data from the desired memory cell MC in the bank BNK in accordance with a command and an address. The read/write engine transfers the read data to a DQ buffer in the input/output circuit.

The address controller receives a row address and a column address, for example, and decodes these addresses. The command controller receives commands indicating various types of operations including a data read operation and a data write operation and transfers those commands to the read/write engine.

The input/output circuit (IO) takes in a command and an address from a CA terminal CA and transfers the command to the command controller and the address to the address controller. The command can be a write command that instructs a write operation or a read command that instructs a read operation. The address can be a bank address indicating any of the banks BNK in the memory cell array MCA and an address indicating a page or a memory cell MC in the bank BNK for which reading or writing is to be performed. In a case where a plurality of the banks BNK form one bank group, the address can be an address of a bank group.

The input/output circuit takes in write data from a DQ terminal and transfers the write data to the read/write buffer RWB, or receives read data retained in the data latch DL and outputs the read data via the DQ terminal.

A memory controller (not illustrated) that controls all the memory chips 1 can be provided outside the memory chip 1.

Figure 2:
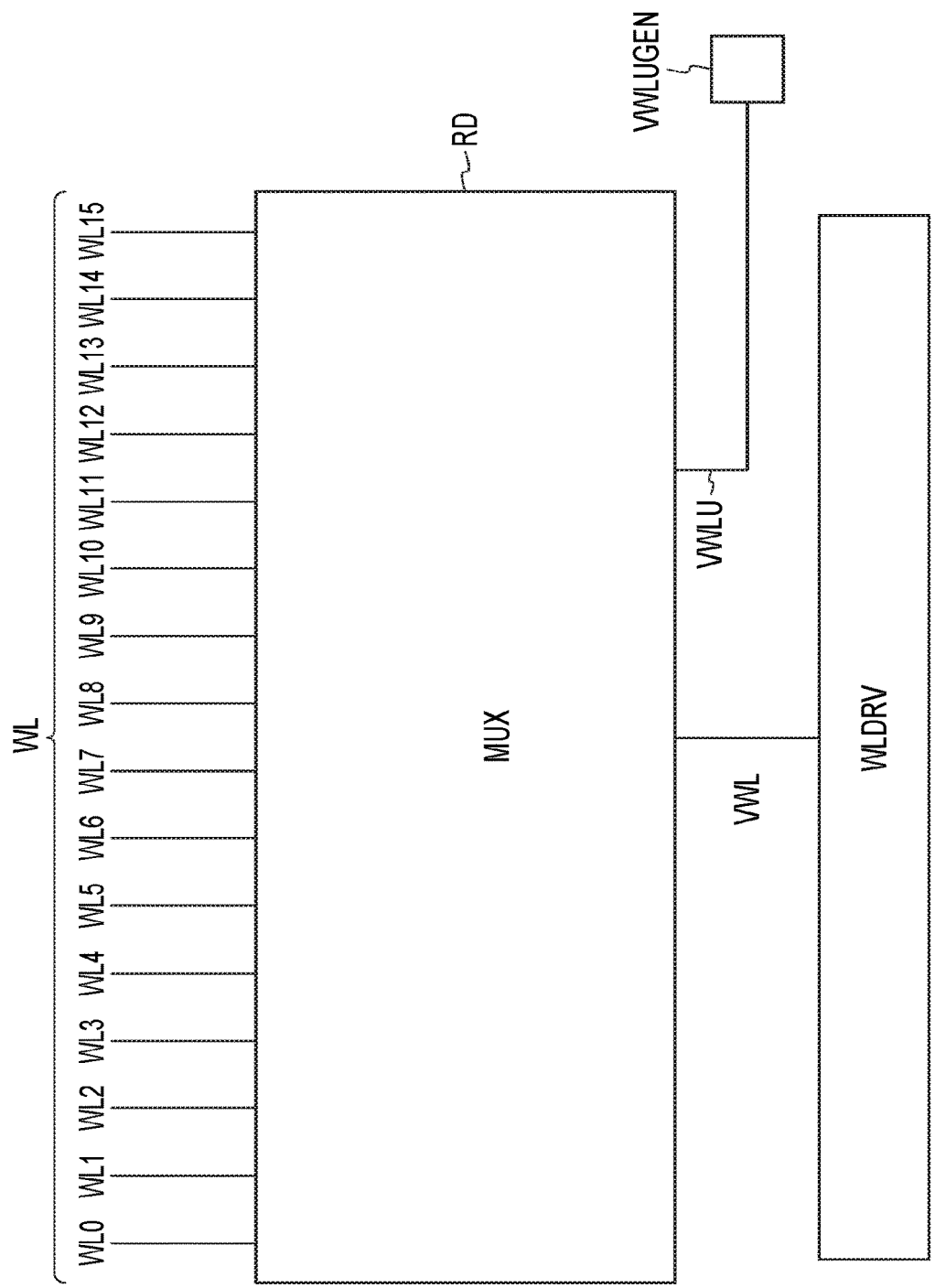
FIG. 2 is a block diagram illustrating a configuration example of the row decoder, a word-line driver, and the word lines.

FIG. 2 is a block diagram illustrating a configuration example of the row decoder RD, a word-line driver WLDRV, and the word lines WL. The row decoder RD includes a multiplexer MUX. The word-line driver WLDRV is configured as a portion of the voltage generator described above.

The multiplexer MUX is provided between the word lines WL and the word-line driver WLDRV. The multiplexer MUX is configured to be able to receive a selection voltage VWL and a non-selection voltage VWLU and to apply either of the voltages to each word line WL. The internal configuration of the multiplexer MUX is described later.

The word-line driver WLDRV applies a write voltage (for example, VDD or VSS) or a read voltage to a selected memory cell MC as the selection voltage VWL, for example.

A non-selection voltage generator VWLUGEN generates a non-selection voltage VWLU to be applied to a non-selected memory cell MC that is not selected. The non-selection voltage generator VWLUGEN can be incorporated in the peripheral circuit PC or be provided outside the memory chip 1. The non-selection voltage VWLU can be a ground voltage, for example. The selection voltage VWL can be a predetermined voltage generated from a power-supply voltage.

Figure 3:
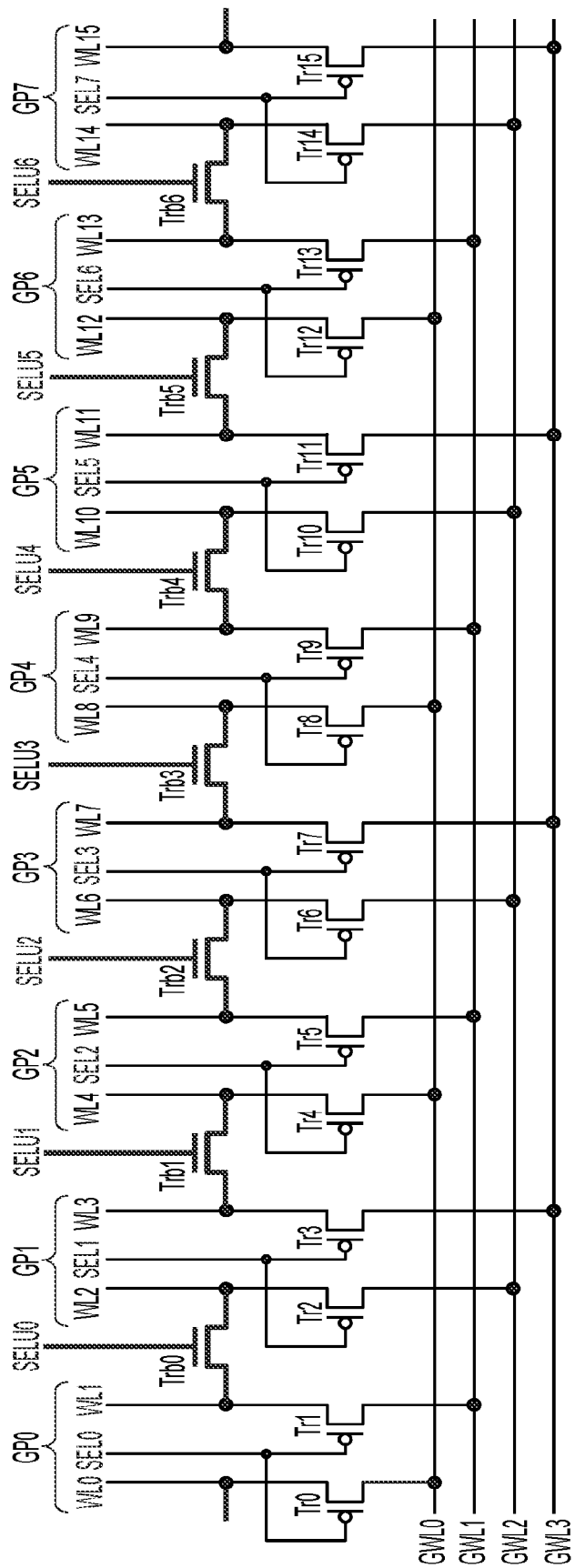
FIG. 3 is a circuit diagram illustrating a configuration example of the multiplexer in the row decoder according to the first embodiment.

FIG. 3 is a circuit diagram illustrating a configuration example of the multiplexer MUX in the row decoder RD according to the first embodiment. In the following descriptions, the multiplexer MUX is provided in the row decoder RD that selectively drives the word lines WL as first signal lines. In this case, second signal lines are the bit lines BL. However, the multiplexer MUX can be provided in the column decoder CD that selectively drives the bit lines BL. In this case, the second signal lines are the word lines WL. Furthermore, the multiplexer MUX can be provided in both the column decoder CD and the row decoder RD.

The word lines WL are divided into a plurality of groups each including m (m is an integer equal to or larger than 2) word lines WL. In the present embodiment, 16 word lines WL are divided into 8 groups GP0 to GP7 each including 2 word lines WL, for example. That is, m=2 is established in the present embodiment. Division of the word lines WL means conceptual division with regard to an operation in which voltages are applied to the word lines WL. The total number of the word lines WL, the number of the groups, and the number of the word lines WL included in each group are not specifically limited.

Global word lines GWL0 to GWL3 as global signal lines are provided for pairs of two adjacent groups GP0 and GP1, GP2 and GP3, GP4 and GP5, and GP6 and GP7 in common. The number of the global word lines GWL0 to GWL3 is equal to the number of the word lines WL included in the two adjacent groups. In the present embodiment, two word lines WL are included in each of the groups GP0 to GP7, and four word lines WL are included in the two adjacent groups GP0 and GP1, GP2 and GP3, GP4 and GP5, or GP6 and GP7, for example. Therefore, in the present embodiment, the four global word lines GWL0 to GWL3 are provided for the pairs of the two adjacent groups GP0 and GP1, GP2 and GP3, GP4 and GP5, and GP6 and GP7 in common.

The global word lines GWL0 to GWL3 respectively correspond to four word lines WL0 to WL3, WL4 to WL7, WL8 to WL11, or WL12 to WL15 included in the two adjacent groups. For example, the global word line GWL0 corresponds to the word line WL0 in the group GP0 and is connected to the word line WL0 via a transistor Tr0. The global word line GWL1 corresponds to the word line WL1 in the group GP0 and is connected to the word line WL1 via a transistor Tr1. The global word line GWL2 corresponds to the word line WL2 in the group GP1 and is connected to the word line WL2 via a transistor Tr2. The global word line GWL3 corresponds to the word line WL3 in the group GP1 and is connected to the word line WL3 via a transistor Tr3. Similarly, the global word lines GWL0 to GWL3 are connected to the word lines WL4 to WL7 in the groups GP2 and GP3 via transistors Tr4 to Tr7, respectively, to the word lines WL8 to WL11 in the groups GP4 and GP5 via transistors Tr8 to Tr11, respectively, and to the word lines WL12 to WL15 in the groups GP6 and GP7 via transistors Tr12 to Tr15, respectively.

In data writing or reading, any one of the global word lines GWL0 to GWL3 transmits the selection voltage VWL and the remaining global word lines transmit the non-selection voltage VWLU. In the following descriptions, the global word line that transmits the selection voltage VWL is referred to as "selected global word line" and the global word lines that transmit the non-selection voltage VWLU are referred to as "non-selected global word lines". The non-selected global word lines do not become an electrically floating state, but transmit the non-selection voltage VWLU.

In the present embodiment, the selected global word line is any one of the global word lines GWL0 to GWL3, and the remaining three global word lines are the non-selected global word lines. However, the number of the multiplexers MUX provided in the row decoder RD in FIG. 3 can be plural. In this case, the number of the global word lines is five or more, and the global word lines can be the selected global word lines.

The transistors Tr0 to Tr15 as first transistors are provided to correspond to the word lines WL0 to WL15, respectively. The transistors Tr0 to Tr15 are connected between the corresponding word lines WL0 to WL15 and any of the global word lines GWL0 to GWL3, respectively. The transistors Tr0 to Tr15 are each configured by a p-MOSFET (Metal Oxide Semiconductor Field Effect Transistor), for example. However, the transistors Tr0 to Tr15 can be configured by n-MOSFETs. Furthermore, a device other than a transistor can be used as long as it has a switching function capable of switching connection.

Selection signal lines SEL0 to SEL7 are provided to correspond to the groups GP0 to GP7, respectively, and are each connected to gate electrodes of the two transistors Tr0 and Tr1, Tr2 and Tr3, Tr4 and Tr5, Tr6 and Tr7, Tr8 and Tr9, Tr10 and Tr11, Tr12 and Tr13, or Tr14 and Tr15 in the corresponding one of the groups GP0 to GP7 in common. For example, the selection signal line SEL0 is connected to the gate electrodes of the transistors Tr0 and Tr1 included in the group GP0 in common. The selection signal line SEL1 is connected to the gate electrodes of the transistors Tr2 and Tr3 included in the group GP1 in common. The selection signal line SEL2 is connected to the gate electrodes of the transistors Tr4 and Tr5 included in the group GP2 in common. The selection signal line SEL3 is connected to the gate electrodes of the transistors Tr6 and Tr7 included in the group GP3 in common. Similarly, the selection signal lines SEL4 to SEL7 are each connected to gate electrodes of two transistors included in the corresponding one of the groups GP4 to GP7 in common. Accordingly, the selection signal lines SEL0 to SEL7 drive the transistors Tr0 to Tr15 for each of the groups GP0 to GP7. The voltages of the selection signal lines SEL0 to SEL7 are raised or are caused to fall by the peripheral circuit PC.

For example, the transistors Tr0 to Tr15 can be p-MOSFETs. In this case, the selection signal lines SEL0 to SEL7 are low-active, that is, allow current to flow therethrough when low voltage signal is supplied to gate electrodes thereof. Therefore, when the group GP0 is selected, the peripheral circuit PC causes the selection signal line SEL0 to fall, thereby bringing the transistors Tr0 and Tr1 corresponding to the group GP0 to a conducting state (ON). Accordingly, the transistors Tr0 and Tr1 electrically connect the word lines WL0 and WL1 in the group GP0 to the global word lines GWL0 and GWL1, respectively. That is, when a selected group is GP0, the transistors Tr0 and Tr1 electrically connect the two word lines WL0 and WL1 included in the selected group GP0 and the two global word lines GWL0 and GWL1 to each other, respectively. Similarly, when the group GP1 is selected, the peripheral circuit PC causes the selection signal line SEL1 to fall, thereby bringing the transistors Tr2 and Tr3 corresponding to the group GP1 to a conducting state (ON). Accordingly, the transistors Tr2 and Tr3 connect the word lines WL2 and WL3 in the group GP1 to the global word lines GWL2 and GWL3, respectively. That is, when a selected group is GP1, the transistors Tr2 and Tr3 electrically connect the two word lines WL2 and WL3 included in the selected group GP1 and the two global word lines GWL2 and GWL3 to each other, respectively. An operation of selecting any of the groups GP2 to GP7 is also performed in a similar manner.

Bypass transistors Trb0 to Trb6 as second transistors are each connected between word lines that respectively belong to two groups adjacent to each other. In the present embodiment, the bypass transistors Trb0 to Trb6 are provided between each group and two groups that are adjacent to that group on both sides. For example, the bypass transistors Trb0 and Trb1 are provided between the group GP1 and the groups GP0 and GP2 that are adjacent to the group GP1 on both sides. The bypass transistor Trb0 is connected between the word line WL2 in the group GP1 and the word line WL1 in the group GP0 adjacent to the word line WL2. The bypass transistor Trb1 is connected between the word line WL3 in the group GP1 and the word line WL4 in the group GP2 adjacent to the word line WL3. The bypass transistors Trb2 and Trb3 are provided between the group GP3 and the groups GP2 and GP4 that are adjacent to the group GP3 on both sides. The bypass transistor Trb2 is connected between the word line WL6 in the group GP3 and the word line WL5 in the group GP2 adjacent to the word line WL6. The bypass transistor Trb3 is connected between the word line WL7 in the group GP3 and the word line WL8 in the group GP4 adjacent to the word line WL7. The bypass transistors Trb4 and Trb5 are provided between the group GP5 and the groups GP4 and GP6 that are adjacent to the group GP5 on both sides. The bypass transistor Trb4 is connected between the word line WL10 in the group GP5 and the word line WL9 in the group GP4 adjacent to the word line WL10. The bypass transistor Trb5 is connected between the word line WL11 in the group GP5 and the word line WL12 in the group GP6 adjacent to the word line WL11. Each of the bypass transistor Trb6 and transistors after the bypass transistor Trb6 is also connected between word lines respectively included in adjacent groups in a similar manner. Although a relation of connection of bypass transistors when viewed from the groups GP1, GP3, and GP5 has been described, a similar description can be also applied to a relation of connection of bypass transistors when viewed from the groups GP0, GP2, GP4, and GP6. That is, it can be said that the bypass transistors are provided between the groups GP0, GP2, GP4, and GP6 and groups adjacent to those groups on both sides. The number of the bypass transistors corresponding to each group is m of the word lines in each group or half the number of global word lines as described later.

The bypass transistors Trb0 to Trb6 are configured by n-MOSFETs, for example. However, the bypass transistors Trb0 to Trb6 can be configured by p-MOSFETs. Furthermore, a device other than a transistor can be used, as long as it has a switching function capable of switching connection.

Bypass selection signal lines SELU0 to SELU6 are connected to gate electrodes of the bypass transistors Trb0 to Trb6, respectively. Accordingly, the bypass selection signal lines SELU0 to SELU6 drive the bypass transistors Trb0 to Trb6. The voltages of the bypass selection signal lines SELU0 to SELU6 are raised or are caused to fall by the peripheral circuit PC. For example, the bypass transistors Trb0 to Trb6 can be n-MOSFETs. In this case, the bypass selection signal lines SELU0 to SELU6 are high-active, that is, allow current to flow therethrough when high voltage signal is supplied to gate electrodes thereof.

As described above, each of the bypass transistors Trb0 to Trb6 is connected between a word line in one of two groups adjacent to each other and a word line in the other group in the present embodiment. Accordingly, in data writing or reading, the bypass transistors Trb0 to Trb6 can supply the non-selection voltage VWLU of the global word lines GWL0 to GWL3 by bypass to word lines disconnected from the global word lines GWL0 to GWL3. That is, the bypass transistors Trb0 to Trb6 can prevent non-selected word lines from becoming an electrically floating state by applying the non-selection voltage VWLU to the non-selected word lines. As described above, one of the global word lines GWL0 to GWL3 has the selection voltage VWL and the remaining three global word lines are kept to have the non-selection voltage VWLU. Therefore, the selection voltage VWL is applied to only one of two word lines in the selected group, and the non-selection voltage VWLU is applied to the other word line. In addition, the non-selection voltage VWLU is applied to all non-selected word lines in the non-selected group. By voltage application in this manner, it is possible to reduce the influence of the selection voltage VWL of the selected word line on the non-selected word lines, and it is possible to prevent disturb (unintentional writing) on memory cells connected to the non-selected word lines from being occurred.

Furthermore, in the present embodiment, addition of the bypass transistors Trb0 to Trb6 can eliminate the necessity of a dedicated global word line for transmitting the non-selection voltage VWLU, so that the number of global word lines can be minimized.

Figure 4:
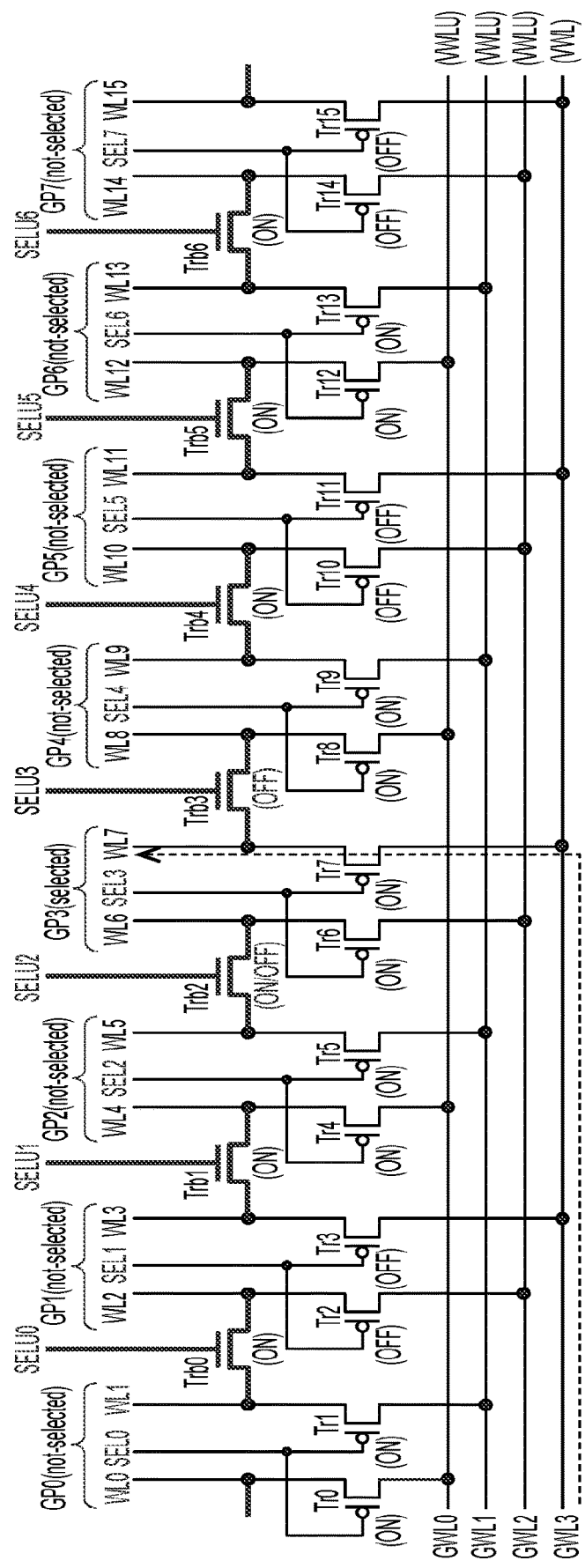
FIG. 4 is a diagram illustrating a state in a case of selecting the word line in the group.

For example, FIG. 4 is a diagram illustrating a state in a case of selecting the word line WL7 in the group GP3. In the first embodiment, global word lines are illustrated by four bits (GWL0 to GWL3). The selection signal lines SEL0 to SEL7 respectively switch connection states of corresponding groups each including two word lines. The bypass selection signal lines SELU0 to SELU6 control the bypass transistors Trb0 to Trb6 by one bit each.

In a case where the word line WL7 is a selected word line, the group GP3 is a selected group. Therefore, the selection signal line SEL3 falls to a low level and the transistors Tr6 and Tr7 are brought to a conducting state (ON).

At this time, the selection voltage VWL is applied to the global word line GWL3 connected to the selected word line WL7. The non-selection voltage VWLU is applied to the remaining global word lines GWL0 to GWL2. That is, in this case, the global word line GWL3 is a selected global word line and the remaining global word lines GWL0 to GWL2 are non-selected global word lines.

The word line WL6 that is in the same selected group GP3 as the selected word line WL7 is a non-selected word line. The non-selected word line WL6 is connected to the non-selected global word line GWL2 via the transistor Tr6 and is fixed to the non-selection voltage VWLU.

The groups GP0 to GP2 and GP4 to GP7 other than the selected group GP3 are non-selected groups. The word lines WL0 to WL5 and WL8 to WL15 included in the non-selected groups GP0 to GP2 and GP4 to GP7 are non-selected word lines. The non-selected groups GP0 to GP2 and GP4 to GP7 are classified into the groups GP1, GP5, and GP7 connected to the selected global word line GWL3 and the groups GP0, GP2, GP4, and GP6 not connected to the selected global word line GWL3.

The non-selected groups GP1, GP5, and GP7 as first non-selected groups share the selected global word line GWL3 with the selected group GP3. That is, the non-selected word lines WL3, WL11, and WL15 included in the non-selected groups GP1, GP5, and GP7 are connected to the selected global word line GWL3 via the transistors Tr3, Tr11, and Tr15. Therefore, when the transistors Tr3, Tr11, and Tr15 become a conducting state, the word lines WL3, WL11, and WL15 are connected to the selected global word line GWL3 and transmit the selection voltage VWL, although they are non-selected word lines. To avoid this connection, the selection signal lines SEL1, SEL5, and SEL7 corresponding to the non-selected groups GP1, GPS, and GP7 are kept at a high level, and the transistors Tr2, Tr3, Tr10, Tr11, Tr14, and Tr15 are brought to a non-conducting state (OFF).

The non-selected word lines WL0, WL1, WL4, WL5, WL8, WL9, WL12, and WL13 included in the non-selected groups GP0, GP2, GP4, and GP6 as second non-selected groups are not connected to the selected global word line GWL3. Therefore, the selection signal lines SEL0, SEL2, SEL4, and SEL6 corresponding to the non-selected groups GP0, GP2, GP4, and GP6 are caused to fall to a low level, so that the transistors Tr0, Tr1, Tr4, Try, Tr8, Tr9, Tr12, and Tr13 are brought to a conducting state (ON). Accordingly, the non-selected word lines WL0, WL1, WL4, WL5, WL8, WL9, WL12, and WL13 are each connected to any of the non-selected global word lines GWL0 to GWL2, and are fixed to the non-selection voltage VWLU.

The bypass selection signal line SELU3 is kept at a low level, and the bypass transistor Trb3 connected to the selected word line WL7 is in a non-conducting state. Accordingly, the selected word line WL7 is electrically disconnected from the non-selected word line WL8, and the selection voltage VWL of the selected global word line GWL3 can be normally transmitted to the selected word line WL7. To the non-selected word line WL8, the non-selection voltage VWLU of the non-selected global word line GWL0 can be normally transmitted. Furthermore, a flow-through current from the selected global word line GWL3 to the non-selected global word line GWL0 can be prevented.

Meanwhile, the bypass selection signal lines SELU0 to SELU2 and SELU4 to SELU6 are raised to a high level, and the bypass transistors Trb0 to Trb2 and Trb4 to Trb6 are brought to a conducting state. By bringing the bypass transistor Trb0 to a conducting state, the non-selected word lines WL1 and WL2 are short-circuited to each other, so that the non-selection voltage VWLU of the non-selected global word line GWL1 is transmitted not only to the non-selected word line WL1 but also to the non-selected word line WL2. By bringing the bypass transistor Trb1 to a conducting state, the non-selected word lines WL3 and WL4 are short-circuited to each other, so that the non-selection voltage VWLU of the non-selected global word line GWL0 is transmitted not only to the non-selected word line WL4 but also to the non-selected word line WL3. Similarly, by bringing the bypass transistor Trb4 to a conducting state, the non-selection voltage VWLU of the non-selected global word line GWL1 is transmitted not only to the non-selected word line WL9 but also to the non-selected word line WL10. By bringing the bypass transistor Trb5 to a conducting state, the non-selection voltage VWLU of the non-selected global word line GWL0 is transmitted not only to the non-selected word line WL12 but also to the non-selected word line WL11. By bringing the bypass transistor Trb6 to a conducting state, the non-selection voltage VWLU of the non-selected global word line GWL1 is transmitted not only to the non-selected word line WL13 but also to the non-selected word line WL14.

As described above, the bypass transistors Trb0 to Trb2 and Trb4 to Trb6 connected between non-selected word lines, other than the bypass transistor Trb3 connected to the selected word line WL7, are brought to a conducting state. Therefore, the non-selected word lines WL2, WL3, WL10, WL11, WL14, and WL15 disconnected from the non-selected global word lines GWL0 to GWL2 do not become an electrically floating state, but are fixed to the non-selection voltage VWLU. Accordingly, the selection voltage VWL is applied to the selected word line WL7, and the voltages of all the non-selected word lines WL0 to WL6 and WL8 to WL15 other than the selected word line WL7 are fixed to the non-selection voltage VWLU. As a result, it is possible to prevent the selection voltage VWL from adversely affecting memory cells connected to the non-selected word lines WL0 to WL6 and WL8 to WL15 to cause disturb thereon.

The bypass transistor Trb2 connected to the non-selected word line WL6 that is the other word line than the selected word line WL7 in the selected group GP3 can be in either of a conducting state or a non-conducting state. This is because all the transistors Tr4 to Tr7 in the selected group GP3 and the non-selected group GP2 adjacent thereto are in a conducting state and the non-selection voltage VWLU is applied to the non-selected word lines WL4 to WL6.

As described above, according to the present embodiment, each of the bypass transistors Trb0 to Trb6 is provided between two groups adjacent to each other, and is connected between word lines that respectively belong to the two adjacent groups. The groups GP0 to GP7 can be classified into one selected group and two non-selected groups. For example, it is assumed that the word line WL7 is a selected word line electrically connected to the selected global word line GWL3. In this case, the group GP3 is a selected group including the selected word line WL7. The non-selected groups GP1, GP5, and GP7 are the first non-selected groups that are connected to the selected global word line GWL3 but do not include the selected word line WL7. The non-selected groups GP0, GP2, GP4, and GP6 are the second non-selected groups that are not connected to the selected global word line GWL3 and are connected to the non-selected global word lines GWL0 to GWL2.

The transistors Tr0, Tr1, Tr4 to Tr9, Tr12, and Tr13 corresponding to the selected group GP3 and the second non-selected groups GP0, GP2, GP4, and GP6 are in a conducting state. Meanwhile, the transistors Tr2, Tr3, Tr10, Tr11, Tr14, and Tr15 corresponding to the first non-selected groups GP1, GP5, and GP7 are in a non-conducting state. Furthermore, while the bypass transistor Trb3 connected to the selected word line WL7 is in a non-conducting state, the remaining bypass transistors Trb0 to Trb2 and Trb4 to Trb7 not connected to the selected word line WL7 are in a conducting state. The bypass transistor Trb2 connected to the non-selected word line WL6 included in the selected group GP3 can be in either of a conducting state or a non-conducting state. Accordingly, in data writing or reading, the row decoder RD can apply the selection voltage VWL to the selected word line WL7 and can also fix the remaining non-selected word lines WL0 to WL6 and WL8 to WL15 to the non-selection voltage VWLU. As a result, it is possible to access a selected memory cell connected to the selected word line WL7 without causing disturb on memory cells connected to the non-selected word lines WL0 to WL6 and WL8 to WL15.

In a case where the bypass transistors Trb0 to Trb6 are not provided, the non-selected word lines WL2, WL3, WL10, WL11, WL14, and WL15 included in the non-selected groups GP1, GPS, and GP7 become an electrically floating state. In this case, the selection voltage VWL applied to the selected word line WL7 can affect the voltages of the non-selected word lines WL2, WL3, WL10, WL11, WL14, and WL15 that are in a floating state. For example, as miniaturization of the semiconductor storage device 1 progresses, spaces between word lines (bit lines) can reduce, and capacitive couplings can increase. Due to the capacitive coupling, a selection voltage of the selected word line WL7 can affect non-selected word lines left in the electrically floating state. In this case, disturb (unintentional writing of data) on memory cells connected to the non-selected word lines WL2, WL3, WL10, WL11, WL14, and WL15 can occur.

On the other hand, the semiconductor storage device 1 according to the present embodiment can fix the non-selected word lines WL0 to WL6 and WL8 to WL15 other than the selected word line WL7 to the non-selection voltage VWLU. As a result, it is possible to access a selected memory cell connected to the selected word line WL7 without causing disturb on memory cells connected to the non-selected word lines WL0 to WL6 and WL8 to WL15.

Furthermore, in the present embodiment, addition of the bypass transistors Trb0 to Trb6 can eliminate the necessity of a dedicated global word line for transmitting the non-selection voltage VWLU, so that the number of global word lines can be minimized. Therefore, the semiconductor storage device 1 according to the present embodiment can reduce the area and can also apply appropriate voltages to a selected word line and non-selected word lines.

Although the word line WL7 is a selected word line in the above embodiment, the same description can be also applied to a case where any of other word lines is a selected word line. For example, it is assumed that the word line WL9 is a selected word line and the global word line GWL1 is a selected global word line, although not illustrated. In this case, the group GP4 is a selected group including the selected word line WL9. The non-selected groups GP0, GP2, and GP6 are the first non-selected groups that are connected to the selected global word line GWL1 but do not include the selected word line WL9. The non-selected groups GP1, GP3, GP5, and GP7 are the second non-selected groups that are not connected to the selected global word line GWL1 and are connected to the non-selected global word lines GWL0, GWL2, and GWL3.

The transistors Tr2, Tr3, Tr6 to Tr11, Tr14, and Tr15 corresponding to the selected group GP4 and the second non-selected groups GP1, GP3, GP5, and GP7 are in a conducting state. Meanwhile, the transistors Tr0, Tr1, Tr4, Tr5, Tr12, and Tr13 corresponding to the first non-selected groups GP0, GP2, and GP6 are in a non-conducting state. Furthermore, while the bypass transistor Trb4 connected to the selected word line WL9 is in a non-conducting state, the remaining bypass transistors Trb0 to Trb3 and Trb5 to Trb7 not connected to the selected word line WL9 are in a conducting state. The bypass transistor Trb3 connected to the non-selected word line WL8 in the selected group GP4 can be in either of a conducting state or a non-conducting state. Accordingly, in data writing or reading, the row decoder RD can apply the selection voltage VWL to the selected word line WL9 and can also fix the remaining non-selected word lines WL0 to WL8 and WL10 to WL15 to the non-selection voltage VWLU. As a result, it is possible to access a selected memory cell connected to the selected word line WL9 without causing disturb on memory cells connected to the non-selected word lines WL0 to WL8 and WL10 to WL15.

The configurations and the functions described above can be applied not only to the row decoder RD but also to the column decoder CD. In a case of applying them to the column decoder CD, it suffices that "word line" is replaced with "bit line".

Second Embodiment

Figure 5:
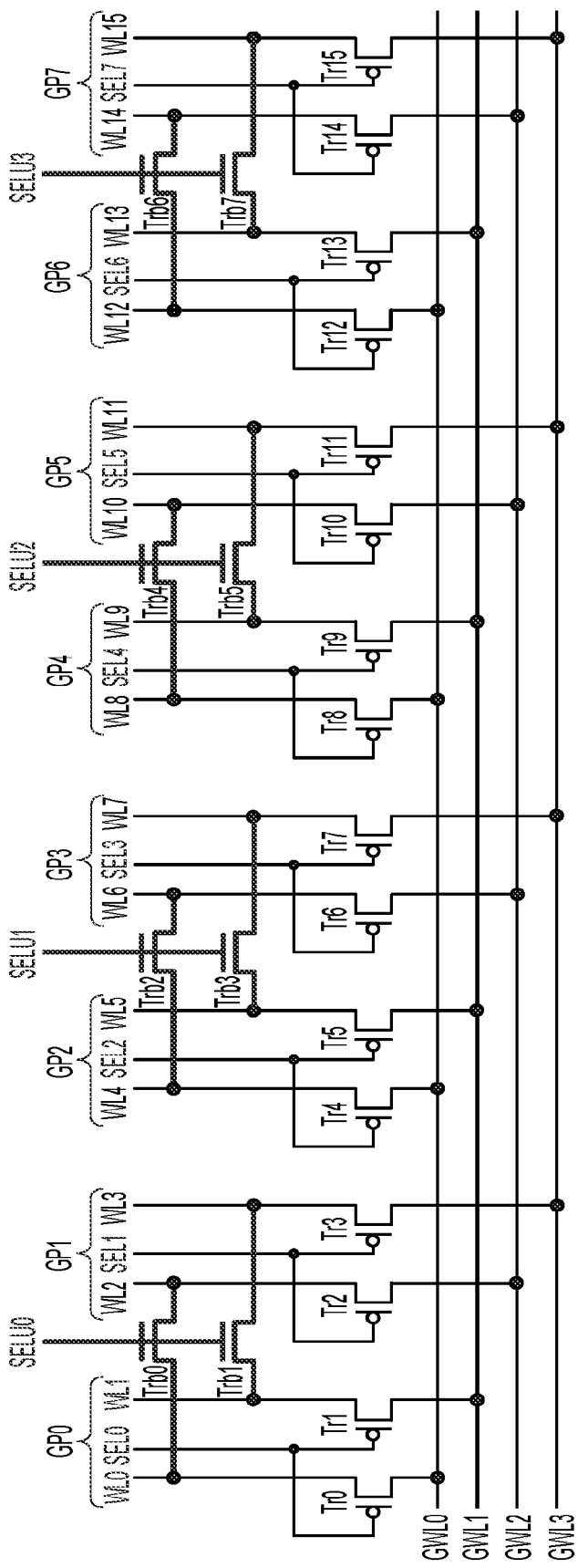
FIG. 5 is a circuit diagram illustrating a configuration example of the multiplexer in the row decoder according to a second embodiment.

FIG. 5 is a circuit diagram illustrating a configuration example of the multiplexer MUX in the row decoder RD according to a second embodiment. In the second embodiment, a relation of connection between the bypass transistors Trb0 to Trb7 and the word lines WL0 to WL15 is different from that in the first embodiment. The bypass transistors Trb0 to Trb7 in the second embodiment are each provided between two groups that are adjacent to each other and are connected to different ones of the global word lines GWL0 to GWL3 from each other. For example, pairs of the bypass transistors Trb0 and Trb1, Trb2 and Trb3, Trb4 and Trb5, and Trb6 and Trb7 are provided between the groups GP0 and GP1, between the groups GP2 and GP3, between the groups GP4 and GP5, and between the groups GP6 and GP7, respectively.

The bypass transistor Trb0 is connected between the word line WL0 and the word line WL2 respectively arranged at one ends of the two groups GP0 and GP1. The bypass transistor Trb1 is connected between the word line WL1 and the word line WL3 respectively arranged at the other ends of the two groups GP0 and GP1. Gate electrodes of the bypass transistors Trb0 and Trb1 are connected to the bypass selection signal line SELU0 in common.

The bypass transistor Trb2 is connected between the word line WL4 and the word line WL6 respectively arranged at one ends of the two groups GP2 and GP3. The bypass transistor Trb3 is connected between the word line WL5 and the word line WL7 respectively arranged at the other ends of the two groups GP2 and GP3. Gate electrodes of the bypass transistors Trb2 and Trb3 are connected to the bypass selection signal line SELU1 in common.

The bypass transistor Trb4 is connected between the word line WL8 and the word line WL10 respectively arranged at one ends of the two groups GP4 and GP5. The bypass transistor Trb5 is connected between the word line WL9 and the word line WL11 respectively arranged at the other ends of the two groups GP4 and GP5. Gate electrodes of the bypass transistors Trb4 and Trb5 are connected to the bypass selection signal line SELU2 in common.

The bypass transistor Trb6 is connected between the word line WL12 and the word line WL14 respectively arranged at one ends of the two groups GP6 and GP7. The bypass transistor Trb7 is connected between the word line WL13 and the word line WL15 respectively arranged at the other ends of the two groups GP6 and GP7. Gate electrodes of the bypass transistors Trb6 and Trb7 are connected to the bypass selection signal line SELU3 in common.

Other configurations of the second embodiment are identical to corresponding ones of the first embodiment.

Figure 6:
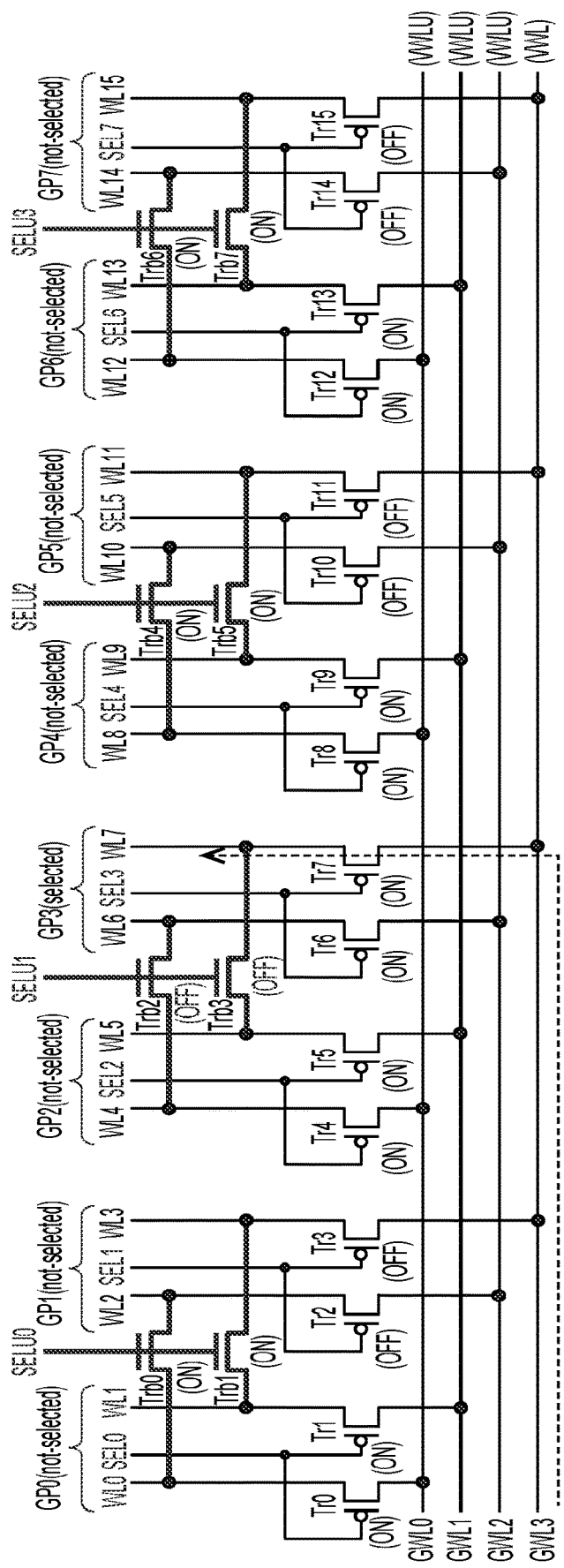
FIG. 6 is a diagram illustrating a state in a case of selecting the word line in the group in the second embodiment.

FIG. 6 is a diagram illustrating a state in a case of selecting the word line WL7 in the group GP3 in the second embodiment. Global word lines are illustrated by four bits (GWL0 to GWL3) in the second embodiment. The selection signal lines SEL0 to SEL7 respectively switch connection states of corresponding groups each including two word lines. The bypass selection signal lines SELU0 to SELU3 control the bypass transistors Trb0 to Trb7 by two bits each.

For example, it is assumed that the word line WL7 is a selected word line and the global word line GWL3 is a selected global word line. In this case, the group GP3 is a selected group including the selected word line WL7. The non-selected groups GP1, GP5, and GP7 are the first non-selected groups that are connected to the selected global word line GWL3 but do not include the selected word line WL7. The non-selected groups GP0, GP2, GP4, and GP6 are the second non-selected groups that are not connected to the selected global word line GWL3 and are connected to the non-selected global word lines GWL0 to GWL2. That is, the conducting state or the non-conducting state of each of the transistors Tr0 to Tr15 is the same as that in the first embodiment.

Furthermore, the bypass transistor Trb3 connected to the selected word line WL7 is in a non-conducting state. The bypass transistors Trb2 and Trb3 are configured to include a common gate electrode. Therefore, in addition to the bypass transistor Trb3, the bypass transistor Trb2 also becomes a non-conducting state. However, since the transistors Tr4 and Tr5 are in a conducting state, the voltages of the word lines WL4 and WL5 can be fixed to the non-selection voltage VWLU. The remaining bypass transistors Trb0, Trb1, and Trb4 to Trb7 not connected to the selected word line WL7 are in a conducting state.

Accordingly, in data writing or reading, the row decoder RD can apply the selection voltage VWL to the selected word line WL7 and can also fix the remaining non-selected word lines WL0 to WL6 and WL8 to WL15 to the non-selection voltage VWLU. Other operations of the second embodiment can be identical to those of the first embodiment. Therefore, the second embodiment can obtain identical effects as those of the first embodiment.

Furthermore, a plurality of bypass transistors provided between two adjacent groups include a common gate electrode in the second embodiment. Therefore, it suffices that the number of bypass selection signal lines SELU0 to SELU3 that drive the bypass transistors Trb0 to Trb7 is half that in the first embodiment. Accordingly, it is possible to reduce the circuit scale of the row decoder RD or the peripheral circuit PC.

Third Embodiment

Figure 7:
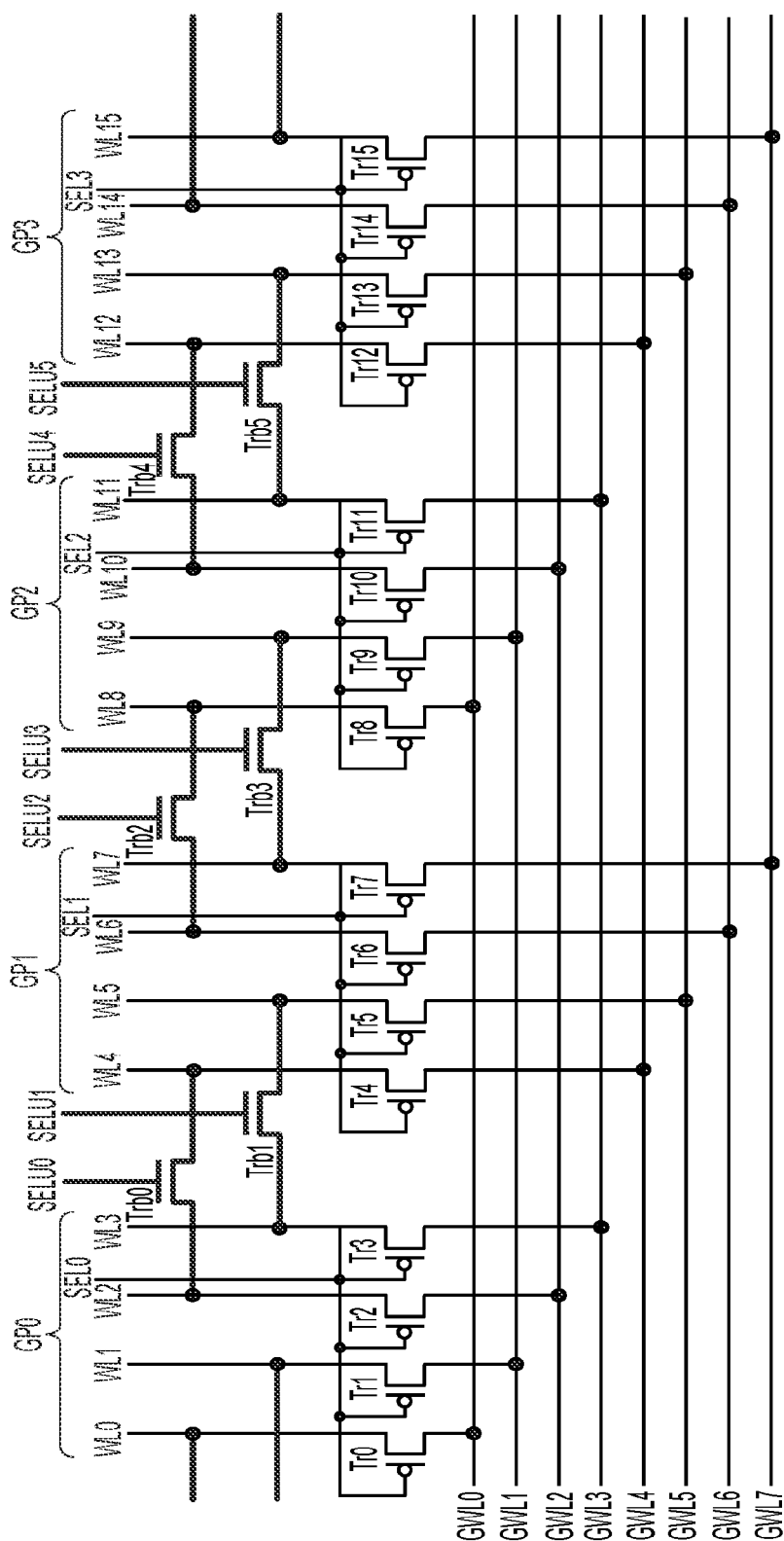
FIG. 7 is a circuit diagram illustrating a configuration example of the multiplexer in the row decoder according to a third embodiment.

FIG. 7 is a circuit diagram illustrating a configuration example of the multiplexer MUX in the row decoder RD according to a third embodiment. In the third embodiment, 16 word lines WL are divided into four groups GP0 to GP3 each including four word lines WL. That is, m=4 is established in the third embodiment.

In association with this division, the eight global word lines GWL0 to GWL7 are provided for the entire word lines WL (all the groups GP0 to GP3) in common. The number of the global word lines GWL0 to GWL7 is equal to the number of the word lines WL included in two groups. For example, in the present embodiment, eight word lines WL are included in the two adjacent groups GP0 and GP1, and eight global word lines GWL0 to GWL7 are provided for the groups GP0 and GP1.

In data writing or reading, any one of the global word lines GWL0 to GWL7 transmits the selection voltage VWL and the remaining global word lines transmit the non-selection voltage VWLU. In the following descriptions, the global word line that transmits the selection voltage VWL is referred to as "selected global word line", and the global word lines that transmit the non-selection voltage VWLU are referred to as "non-selected global word lines". The non-selected global word lines do not become an electrically floating state, but transmit the non-selection voltage VWLU.

The selection signal lines SEL0 to SEL3 are provided to correspond to the groups GP0 to GP3, respectively, and are each connected to gate electrodes of the four transistors Tr0 to Tr3, Tr4 to Tr7, Tr8 to Tr11, or Tr12 to Tr15 in a corresponding one of the groups GP0 to GP3 in common. For example, the selection signal line SEL0 is connected to the gate electrodes of the transistors Tr0 to Tr3 included in the group GP0 in common. The selection signal line SEL1 is connected to the gate electrodes of the transistors Tr4 to Tr7 included in the group GP1 in common. Similarly, the selection signal lines SEL2 and SEL3 are each connected to gate electrodes of four transistors included in the corresponding one of the groups GP2 and GP3 in common. Accordingly, the selection signal lines SEL0 to SEL3 drive the transistors Tr0 to Tr15 for each of the groups GP0 to GP3. The voltages of the selection signal lines SEL0 to SEL3 are raised or are caused to fall by the peripheral circuit PC.

The bypass transistors Trb0 to Trb5 are the same as those of the first embodiment in that each bypass transistor is connected between word lines that respectively belong to two groups adjacent to each other. Furthermore, the bypass transistors Trb0 to Trb5 are provided between each group and two groups that are adjacent to that group on both sides. In the third embodiment, each of the bypass transistors Trb0 to Trb5 is connected between a word line at an end of one of the two groups and an intermediate word line in the other group.

For example, the bypass transistors Trb0 to Trb3 are provided between the group GP1 and the groups GP0 and GP2 that are adjacent to the group GP1 on both sides. The bypass transistor Trb0 is connected between the word line WL2 in the group GP0 and the word line WL4 in the group GP1 adjacent to the group GP0. The bypass transistor Trb1 is connected between the word line WL3 in the group GP0 and the word line WL5 in the group GP1 adjacent to the group GP0. The bypass transistor Trb2 is connected between the word line WL6 in the group GP1 and the word line WL8 in the group GP2 adjacent to the group GP1. The bypass transistor Trb3 is connected between the word line WL7 in the group GP1 and the word line WL9 in the group GP2 adjacent to the group GP1.

The bypass transistors Trb4 and Trb5 are respectively provided between the group GP2 and the group GP3 adjacent thereto. The bypass transistor Trb4 is connected between the word line WL10 in the group GP2 and the word line WL12 in the group GP3 adjacent to the group GP2. The bypass transistor Trb5 is connected between the word line WL11 in the group GP2 and the word line WL13 in the group GP3 adjacent to the group GP2. Similarly, the remaining bypass transistors (not illustrated) are also provided between each group and groups adjacent to that group on both sides.

Other configurations of the third embodiment can be identical to corresponding ones of the first embodiment.

Figure 8:
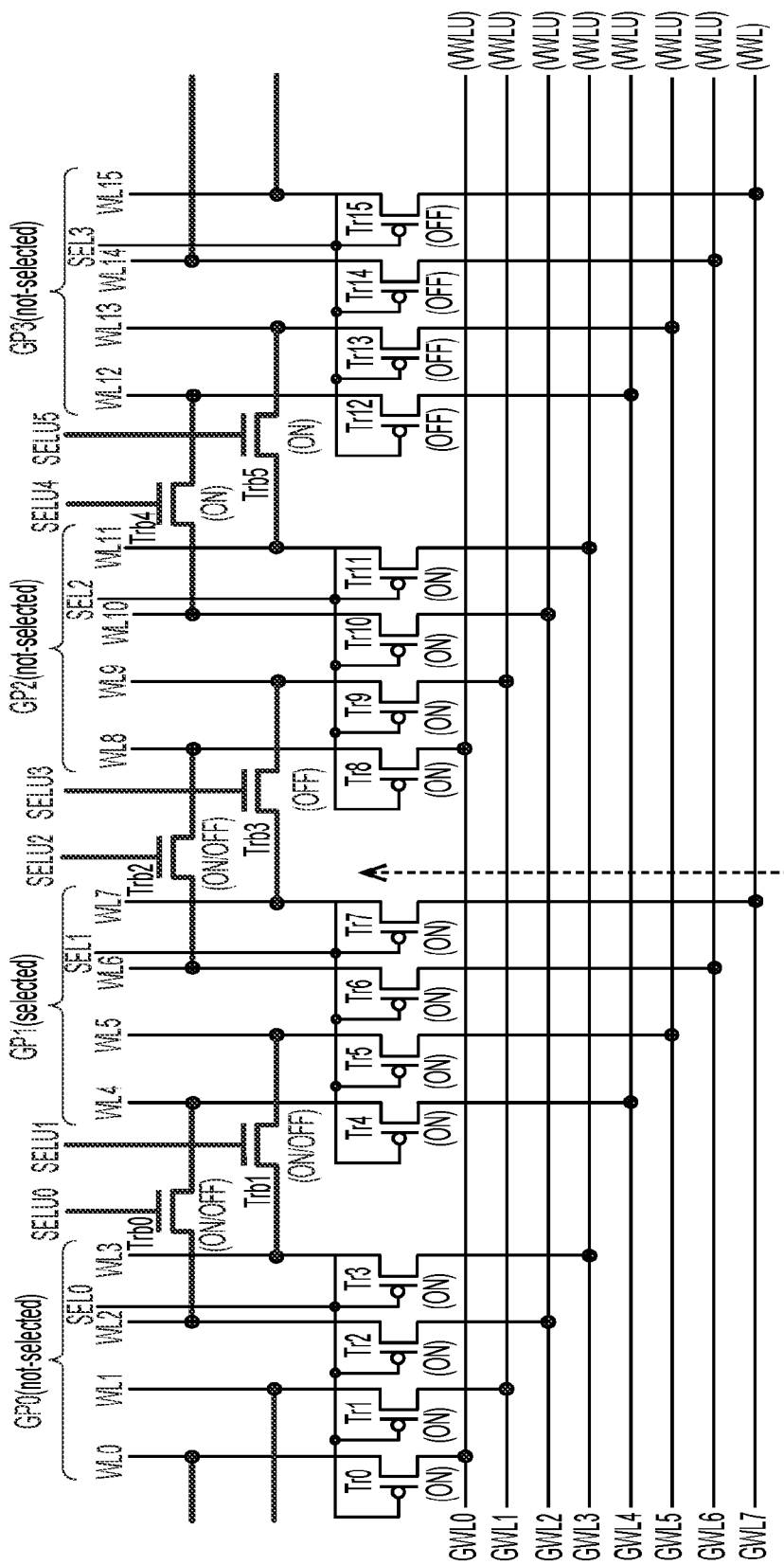
FIG. 8 is a diagram illustrating a state in a case of selecting the word line in the group in the third embodiment.

FIG. 8 is a diagram illustrating a state in a case of selecting the word line WL7 in the group GP1 in the third embodiment. Global word lines are illustrated by eight bits (GWL0 to GWL7) in the third embodiment. The selection signal lines SEL0 to SEL3 respectively switch connection states of corresponding groups each including four word lines. The bypass selection signal lines SELU0 to SELU5 control the bypass transistors Trb0 to Trb5 by one bit each.

For example, it is assumed that the word line WL7 is a selected word line and the global word line GWL7 is a selected global word line. In this case, the group GP1 is a selected group including the selected word line WL7. The non-selected group GP3 is the first non-selected group that is connected to the selected global word line GWL7 but does not include the selected word line WL7. In addition, the non-selected groups GP0 and GP2 are the second non-selected groups that are not connected to the selected global word line GWL7 and are connected to the non-selected global word lines GWL0 to GWL6.

The transistors Tr0 to Tr11 corresponding to the selected group GP1 and the second non-selected groups GP0 and GP2 are in a conducting state. Meanwhile, the transistors Tr12 to Tr15 corresponding to the first non-selected group GP3 are in a non-conducting state.

Furthermore, while the bypass transistor Trb3 connected to the selected word line WL7 is in a non-conducting state, the remaining bypass transistors Trb0 to Trb2, Trb4, and Trb5 not connected to the selected word line WL7 are in a conducting state. The bypass transistors Trb0 to Trb2 connected to the non-selected word lines WL4 to WL6 included in the selected group GP1 can be in either of a conducting state or a non-conducting state.

Accordingly, in data writing or reading, the row decoder RD can apply the selection voltage VWL to the selected word line WL7 and can also fix the remaining non-selected word lines WL0 to WL6 and WL8 to WL15 to the non-selection voltage VWLU. As a result, the third embodiment can obtain identical effects as those of the first embodiment.

In the present embodiment, while the number of global word lines is increased, the number of the selection signal lines SEL0 to SEL3 is reduced to half. Accordingly, it is possible to reduce the circuit scale of the row decoder RD or the peripheral circuit PC.

Fourth Embodiment

Figure 9:
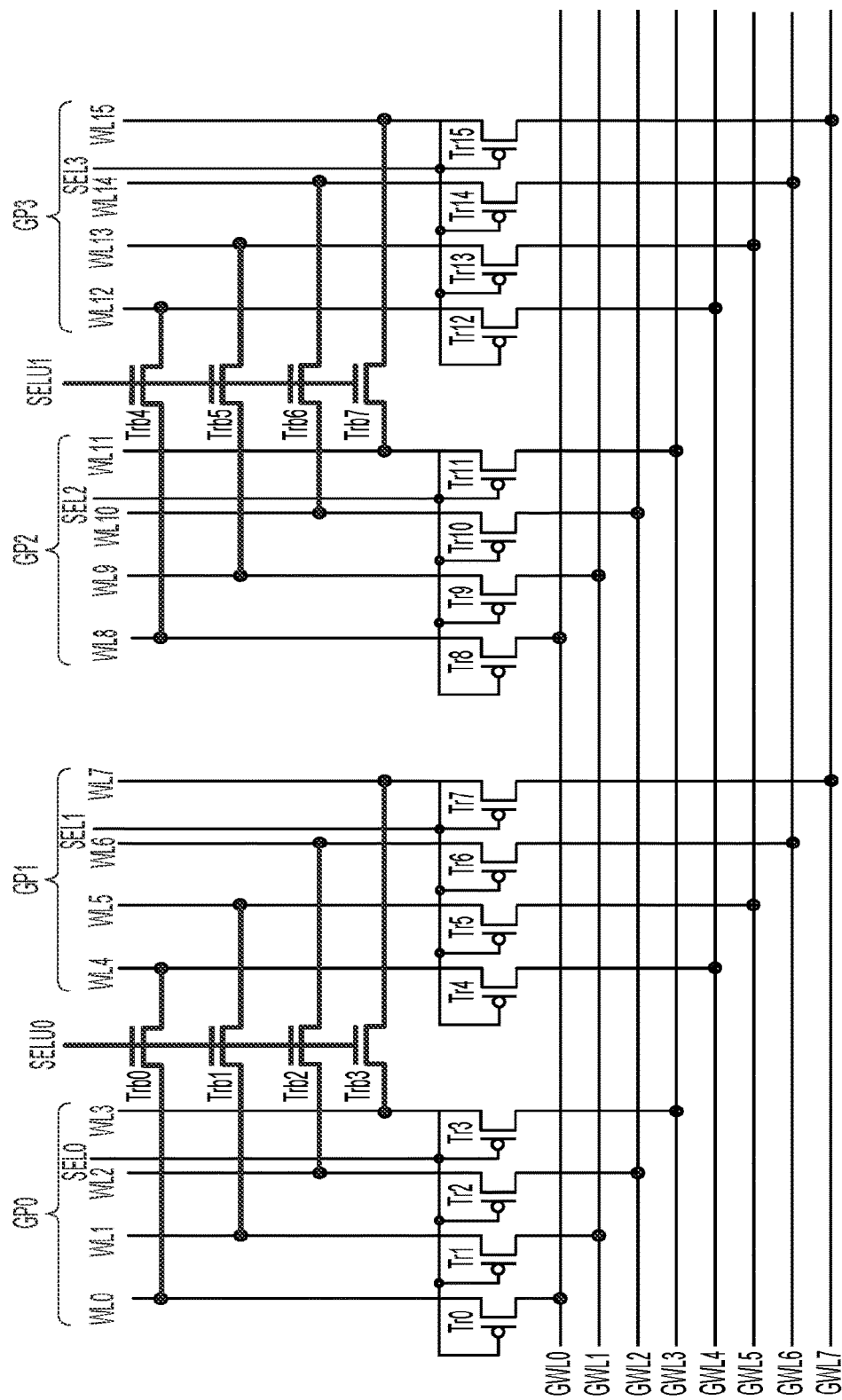
FIG. 9 is a circuit diagram illustrating a configuration example of the multiplexer in the row decoder according to a fourth embodiment.

FIG. 9 is a circuit diagram illustrating a configuration example of the multiplexer MUX in the row decoder RD according to a fourth embodiment. In the fourth embodiment, a relation of connection between the bypass transistors Trb0 to Trb7 and the word lines WL0 to WL15 is different from that in the third embodiment. The bypass transistors Trb0 to Trb7 in the fourth embodiment are each provided between two groups that are adjacent to each other and are connected to different ones of the global word lines GWL0 to GWL3 from each other. For example, the bypass transistors Trb0 to Trb3 are provided between the groups GP0 and GP1, and the bypass transistors Trb4 to Trb7 are provided between the groups GP2 and GP3.

The bypass transistor Trb0 is connected between the word lines WL0 and WL4 respectively arranged at one ends of the two groups GP0 and GP1. The bypass transistor Trb1 is connected between the word lines WL1 and WL5 that are the second word lines from the one ends of the two groups GP0 and GP1. The bypass transistor Trb2 is connected between the word lines WL2 and WL6 that are the third word lines from the one ends of the two groups GP0 and GP1. The bypass transistor Trb3 is connected between the word lines WL3 and WL7 respectively arranged at the other ends of the two groups GPO and GP1. Gate electrodes of the bypass transistors Trb0 to Trb3 are connected to the bypass selection signal line SELU0 in common.

The bypass transistor Trb4 is connected between the word lines WL8 and WL12 respectively arranged at one ends of the two groups GP2 and GP3. The bypass transistor Trb5 is connected between the word lines WL9 and WL13 that are the second word lines from the one ends of the two groups GP2 and GP3. The bypass transistor Trb6 is connected between the word lines WL10 and WL14 that are the third word lines from the one ends of the two groups GP2 and GP3. The bypass transistor Trb7 is connected between the word lines WL11 and WL15 respectively arranged at the other ends of the two groups GP2 and GP3. Gate electrodes of the bypass transistors Trb4 to Trb7 are connected to the bypass selection signal line SELU1 in common.

Other configurations of the fourth embodiment are identical to corresponding ones of the third embodiment.

Figure 10:
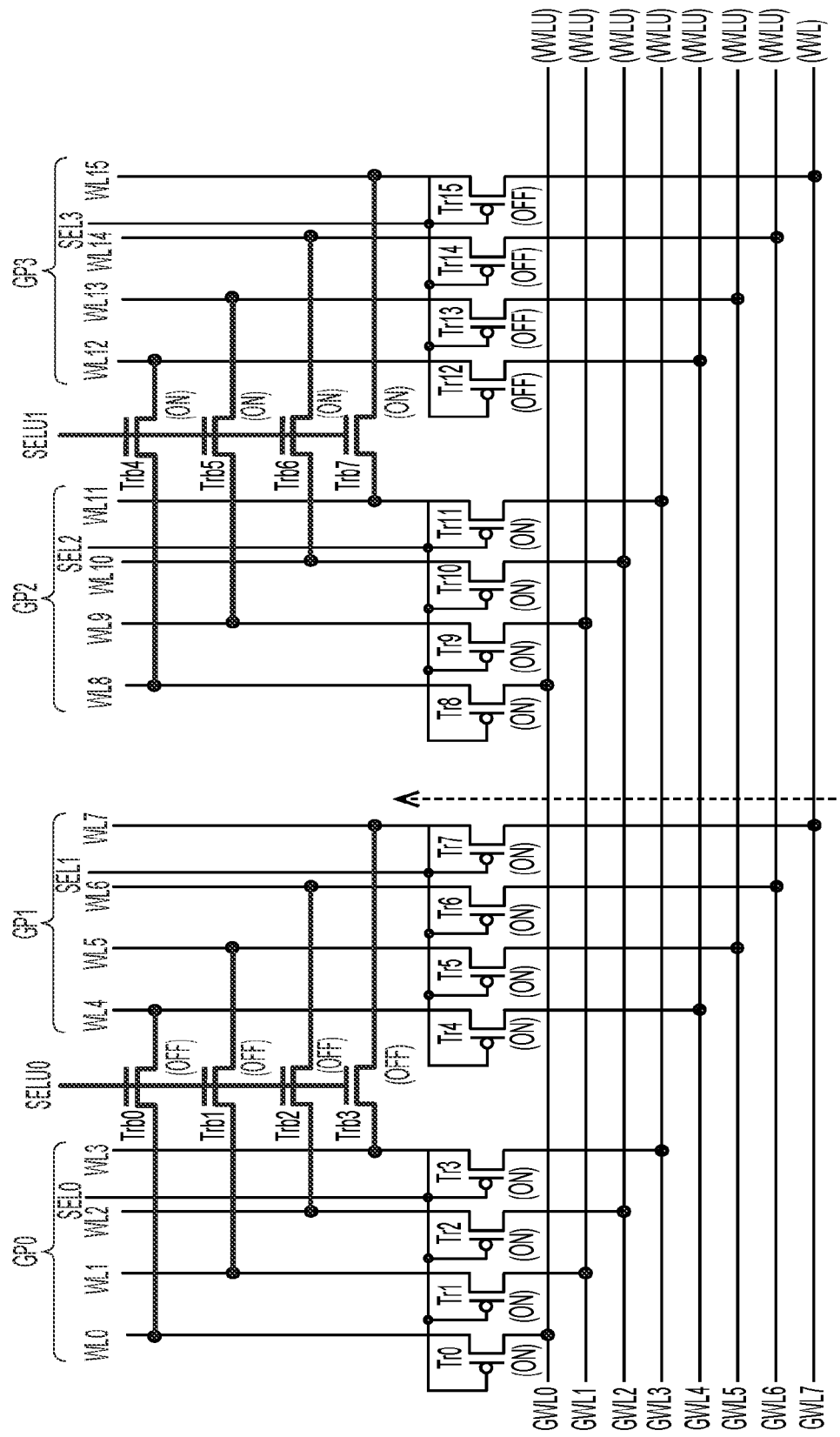
FIG. 10 is a diagram illustrating a state in a case of selecting the word line in the group in the fourth embodiment.

FIG. 10 is a diagram illustrating a state in a case of selecting the word line WL7 in the group GP3 in the fourth embodiment. In the fourth embodiment, global word lines are illustrated by eight bits (GWL0 to GWL7). The selection signal lines SEL0 to SEL3 respectively switch connection states of corresponding groups each including four word lines. The bypass selection signal lines SELU0 and SELU1 control the bypass transistors Trb0 to Trb7 by four bits each.

For example, it is assumed that the word line WL7 is a selected word line and the global word line GWL7 is a selected global word line. In this case, the group GP1 is a selected group including the selected word line WL7. The non-selected group GP3 is the first non-selected group that is connected to the selected global word line GWL7 but does not include the selected word line WL7. The non-selected groups GP0 and GP2 are the second non-selected groups that are not connected to the selected global word line GWL7 and are connected to the non-selected global word lines GWL0 to GWL6.

The transistors Tr0 to Tr11 corresponding to the selected group GP1 and the second non-selected groups GP0 and GP2 are in a conducting state. Meanwhile, the transistors Tr12 to Tr15 corresponding to the first non-selected group GP3 are in a non-conducting state.

The bypass transistor Trb3 connected to the selected word line WL7 and the bypass transistors Trb0 to Trb2 that share a gate with the bypass transistor Trb3 are in a non-conducting state. The remaining bypass transistors Trb4 to Trb7 not connected to the selected word line WL7 are in a conducting state.

Accordingly, in data writing or reading, the row decoder RD can apply the selection voltage VWL to the selected word line WL7 and can also fix the remaining non-selected word lines WL0 to WL6 and WL8 to WL15 to the non-selection voltage VWLU. As a result, the fourth embodiment can obtain identical effects as those of the third embodiment.

Furthermore, a plurality of bypass transistors provided between two adjacent groups include a common gate electrode in the fourth embodiment. Therefore, the number of the bypass selection signal lines SELU0 and SELU1 that drive the bypass transistors Trb0 to Trb7 is further reduced to half that in the third embodiment. Accordingly, it is possible to reduce the circuit scale of the row decoder RD or the peripheral circuit PC.

The embodiments described above are applicable to a cross-point memory mentioned below.

Figure 11:
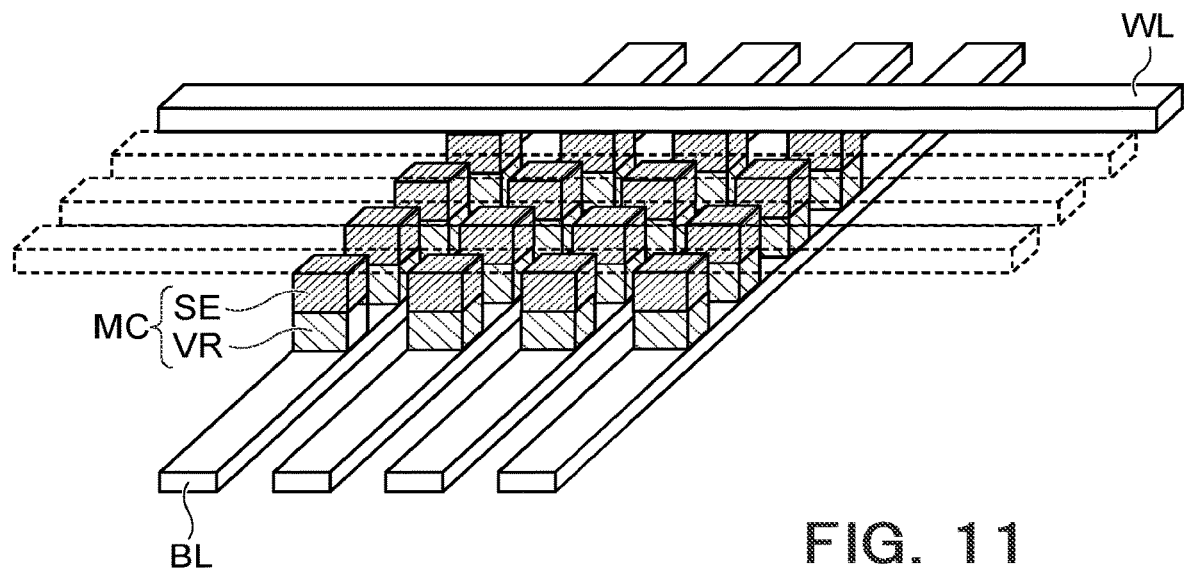
FIG. 11 is a perspective view schematically illustrating the memory cells included in the memory cell array, the bit lines, and the word lines.

FIG. 11 is a perspective view schematically illustrating the memory cells MC included in the memory cell array MCA, the bit lines BL, and the word lines WL.

As illustrated in FIG. 11, the bit lines BL extend in the same direction as each other with an interval therebetween, and the word lines WL extend with an interval therebetween above the bit lines BL in a direction perpendicular to the extending direction of the bit lines BL, for example. The memory cells MC are arranged at respective intersections of the bit lines BL and the word lines WL. By this configuration, a cross-point memory cell array MCA is configured in which the memory cells MC are arranged in a matrix in plan view.

An example in which the bit lines BL and the word lines WL each form one layer and the memory cells MC forming one layer are arranged between those layers has been described. However, the arrangement is not limited thereto. The number of layers in which the memory cells MC are arranged can be increased, and the number of layers of the bit lines BL and/or the number of layers of the word lines WL can be increased correspondingly. For example, the bit lines BL extending with an interval therebetween in a direction perpendicular to the extending direction of the word lines WL can be further provided above the word lines WL in FIG. 11, and the memory cells MC can be further arranged at intersections of the word lines WL and the bit lines BL above the word lines WL. In this case, layers of the memory cells MC are two layers, and wiring layers (the layers of the bit lines BL and the layer of the word lines WL) are three layers. The bit lines BL and the word lines WL can be exchanged with each other.

Figure 12:
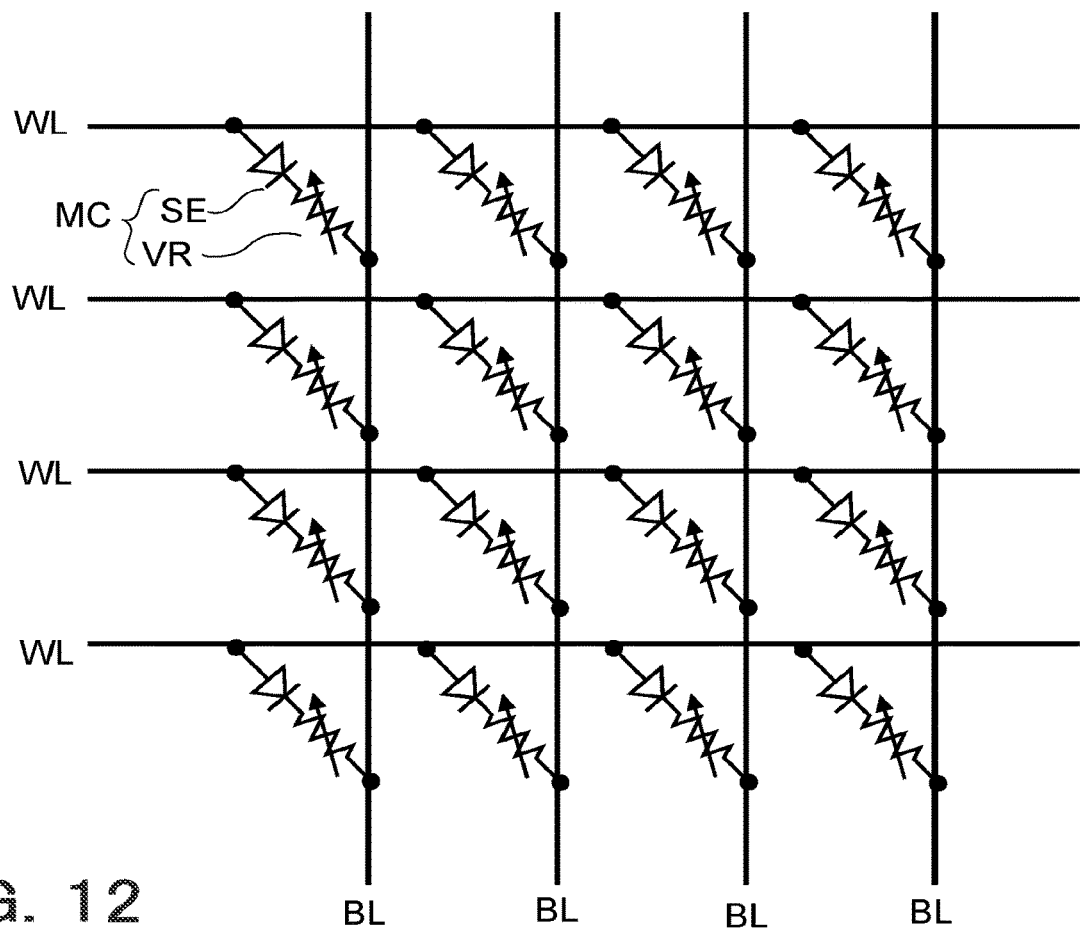
FIG. 12 is a diagram schematically illustrating a circuit configuration of the memory cell array.

FIG. 12 is a diagram schematically illustrating a circuit configuration of the memory cell array MCA. Each memory cell MC is connected between a corresponding word line WL and a corresponding bit line BL. The memory cell MC includes a variable resistance element VR and a switching element SE, for example. The memory cell MC is not limited to a variable resistance element.

The variable resistance element VR can become a low resistance state and a high resistance state. The variable resistance element VR holds 1-bit data by using a difference of a resistance state between the low resistance state and the high resistance state.

The switching element SE becomes a high resistance state (OFF state) when a voltage applied thereto is lower than a threshold value, and becomes a conducting state (ON state) when the applied voltage is equal to or higher than the threshold value. Accordingly, the switching element SE serves as a rectifying element having a rectifying function. The switching element SE can be a bidirectional rectifying element.

Figure 13:
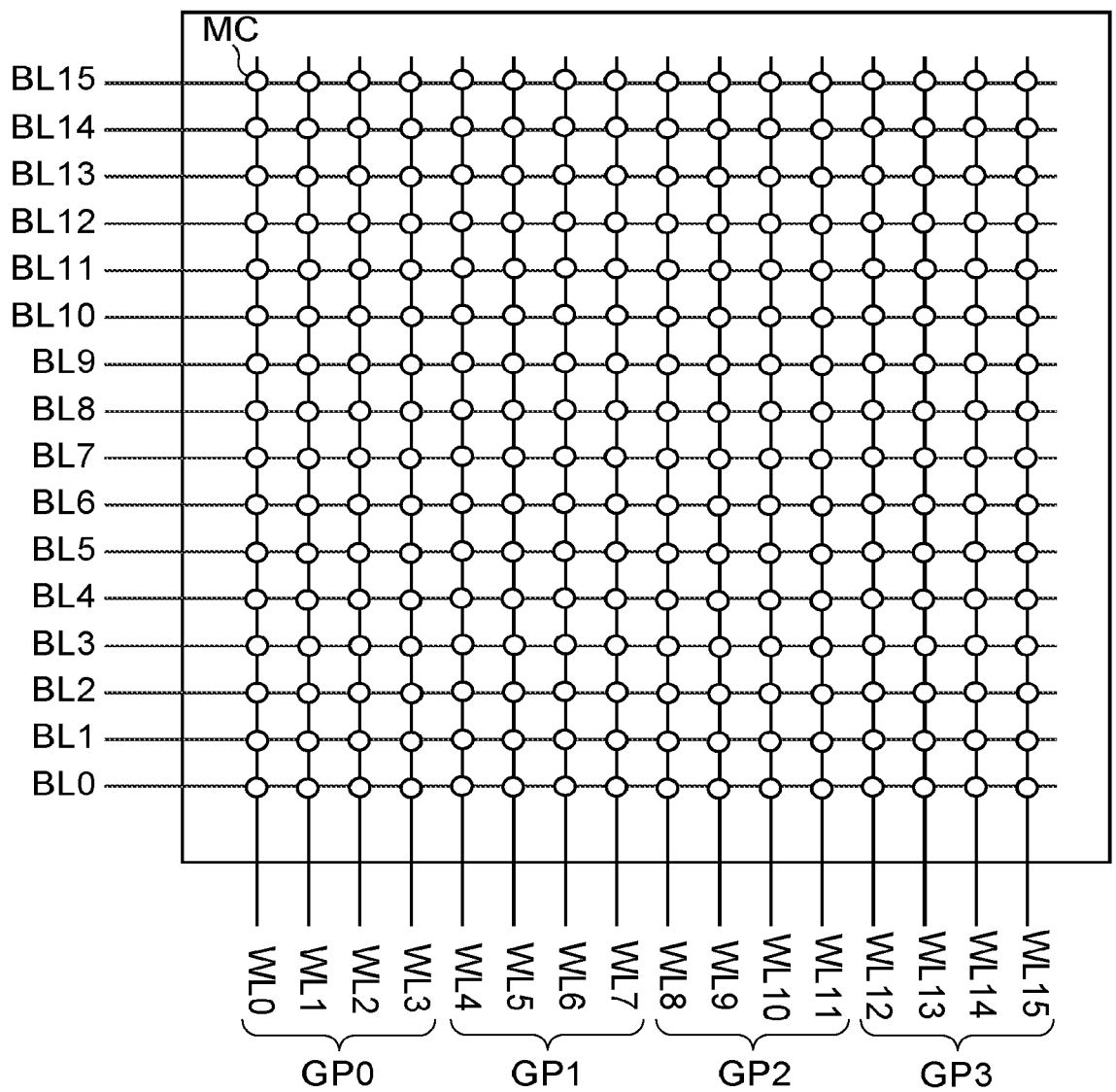
FIG. 13 is a diagram schematically illustrating a relation of connection between the memory cell array, the bit lines, and the word lines.

FIG. 13 is a diagram schematically illustrating a relation of connection between the memory cell array MCA, the bit lines BL, and the word lines WL. For example, 16 bit lines BL and 16 word lines WL are connected to the memory cell array MCA. The bit lines BL and the word lines WL are each divided into four groups GP each including four lines. Although an example in which the total number of the bit lines BL and the total number of the word lines WL are each 16 has been described, the numbers are not limited thereto. Furthermore, although an example in which the number of the bit lines BL in each group GP and the number of the word lines WL in each group GP are four has been described, the numbers are not limited thereto. For example, the total number of the bit lines BL and the total number of the word lines WL can be 1024 as described later. In this case, the bit lines BL and the word lines WL can be each divided into 64 groups GP each including 16 lines. In addition, a plurality of the memory cell arrays MCA can be provided in one semiconductor storage device.

In the above embodiments, an example in which the total number of word lines (bit lines) is 16 and they are divided into two or four groups has been described for simplicity. However, more than 16 word lines can constitute one group. In a case where 1024 word lines are divided into 64 groups, for example, the number m of word lines in each group is 16. In this case, it suffices that 32 global word lines are provided. It suffices that 16 bypass transistors are provided for each group. By this configuration, it is possible to fix non-selected word lines other than a selected word line to the non-selection voltage VWLU.

As the above description is generalized, the number of bypass transistors corresponding to each group is equal to the number m of word lines in each group. Since the number of global word lines is equal to the number (m×2) of word lines in two groups, it can be said that the number of bypass transistors corresponding to each group is half the number of global word lines.

In addition, the number of the bypass selection signal lines SELU0, SELU1, . . . is equal to the number (=m) of bypass transistors as illustrated in FIGS. 3 and 7 in some cases, or is half or a quarter of the number of bypass transistors as illustrated in FIGS. 5 and 9 in other cases.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

The invention claimed is:

1. A semiconductor storage device comprising:
a plurality of first signal lines divided into a plurality of groups respectively including m (m is an integer equal to or larger than 2) first signal lines;
a plurality of second signal lines;
a memory cell array including a plurality of memory cells provided to correspond to respective intersections of the first signal lines and the second signal lines;
a plurality of global signal lines provided to respectively correspond to the first signal lines included in one or a plurality of the groups, the global signal lines including a selected global signal line configured to transmit a selection voltage and a non-selected global signal line configured to transmit a non-selection voltage;
a plurality of first transistors provided to respectively correspond to the first signal lines, one of the first transistors being connected between a corresponding one of the first signal lines and any of the global signal lines;
a plurality of selection signal lines provided to respectively correspond to the groups, one of the selection signal lines being connected to gate electrodes of the first transistors included in a corresponding one of the groups in common; and
a plurality of second transistors connected between the first signal lines that respectively belong to adjacent two of the groups, wherein
when one of the first signal lines is electrically connected to the selected global signal line as a selected first signal line, the first transistors corresponding to one of the groups which includes the selected first signal line are in a conducting state, and one of the second transistors which is connected to the selected first signal line is in a non-conducting state.

2. The device of claim 1, wherein
the groups include a selected group that includes the selected first signal line electrically connected to the selected global signal line, a first non-selected group that is connected to the selected global signal line but does not include the selected first signal line, and a second non-selected group that is not connected to the selected global signal line but is connected to the non-selected global signal line,
the first transistors corresponding to the first non-selected group are in a non-conducting state, and
the first transistors corresponding to the second non-selected group are in a conducting state.

3. The device of claim 2, wherein
the second transistors connected to the first signal lines included in the second non-selected group are in a conducting state, and
the second transistor connected to another one of the first signal lines included in the selected group is in either of a conducting state or a non-conducting state, the another one of the first signal lines being different from the selected first signal line.

4. The device of claim 1, wherein the second transistors are each provided between one of the groups and two of the groups that are adjacent thereto on both sides.

5. The device of claim 1, wherein
the second transistors are provided between adjacent two of the groups, which are connected to different ones of the global signal lines, and
the second transistors provided between the two adjacent groups include a common gate.

6. The device of claim 1, wherein each of the second transistors is connected between one of the first signal lines in one of adjacent two of the groups and one of the first signal lines in the other group.

7. The device of claim 1, wherein at least one of the second transistors is connected between one of the first signal lines at an end of one of adjacent two of the groups and one of the first signal lines at an end of the other group.

8. The device of claim 1, wherein at least one of the second transistors is connected between one of the first signal lines at an end of one of adjacent two of the groups and an intermediate one of the first signal lines in the other group.

9. The device of claim 1, wherein number of the second transistors corresponding to one of the groups is equal to number of the first signal lines included in one of the groups.

10. The device of claim 1, wherein number of the second transistors corresponding to one of the groups is half of number of the global signal lines.

11. The device of claim 1, wherein non-selected one or a plurality of the first signal lines, other than the selected first signal line, is or are fixed to the non-selection voltage.

12. The device of claim 1, wherein
the first signal lines extend in a first direction and are arranged in a second direction intersecting with the first direction,
the second signal lines extend in the second direction and are arranged in the first direction, and
the memory cells are respectively sandwiched between a corresponding one of the first signal lines and a corresponding one of the second signal lines in a third direction intersecting with the first direction and the second direction.

13. The device of claim 1, wherein
the memory cells respectively include a variable resistance element and a switching element, and
the switching element becomes a high resistance state when a voltage applied thereto is lower than a threshold value, and becomes a conducting state when the applied voltage is equal to or higher than the threshold value.

* * * * *